United States Patent [19]

Nightingale et al.

[11] Patent Number: 5,636,069
[45] Date of Patent: Jun. 3, 1997

[54] OPTICAL SYSTEM FOR IMPROVING THE SYMMETRY OF THE BEAM EMITTED FROM A BROAD AREA LASER DIODE

[75] Inventors: John L. Nightingale, Portola Valley; John A. Trail, Menlo Park; John K. Johnson, Sunnyvale, all of Calif.

[73] Assignee: Coherent, Inc., Santa Clara, Calif.

[21] Appl. No.: 450,817

[22] Filed: May 25, 1995

Related U.S. Application Data

[62] Division of Ser. No. 273,899, Jul. 12, 1994, Pat. No. 5,557,475.

[51] Int. Cl.$^6$ .............................. G02B 5/04; H01S 3/00; H01S 3/091; H01S 3/22
[52] U.S. Cl. ............... 359/831; 359/333; 359/349; 359/615; 359/618; 359/640; 359/837; 372/70; 372/75; 372/108
[58] Field of Search ............... 372/75, 70; 359/831, 359/615, 333, 349, 837, 618, 637, 639, 625, 640; 312/69, 99, 100, 101, 108

[56] References Cited

U.S. PATENT DOCUMENTS

| | | | |
|---|---|---|---|
| 3,932,702 | 1/1976 | Shelley et al. | 178/6.8 |
| 4,056,827 | 11/1977 | Spooner et al. | 358/87 |
| 4,128,308 | 12/1978 | McNaney . | |
| 4,149,773 | 4/1979 | Reid | 359/641 |
| 4,370,026 | 1/1983 | Dubroeucq et al. | 359/578 |
| 4,811,328 | 3/1989 | Ito et al. | 369/112 |
| 4,828,371 | 5/1989 | McCaslin et al. | 359/669 |
| 4,921,338 | 5/1990 | Macken et al. | 359/858 |
| 5,025,438 | 6/1991 | Emoto | 369/112 |
| 5,052,815 | 10/1991 | Nightingale et al. | 372/94 |
| 5,081,637 | 1/1992 | Fan et al. | 372/72 |
| 5,170,409 | 12/1992 | Nightingale et al. | 372/107 |
| 5,381,439 | 1/1995 | English, Jr. et al. | 372/108 |

FOREIGN PATENT DOCUMENTS

| | | | |
|---|---|---|---|
| 0452069 | 4/1991 | European Pat. Off. | H01S 3/083 |
| 0512816 | 5/1991 | European Pat. Off. | H01S 3/05 |
| 0468319 | 7/1991 | European Pat. Off. | H01S 3/00 |
| 3904896 | 2/1989 | Germany | G02B 27/10 |
| 63-153514 | 6/1988 | Japan | G02B 27/00 |

OTHER PUBLICATIONS

"Geometrical Transformation of Linear Diode–Laser Arrays for Longitudinal Pumping of Solid–State Lasers," by James R. Leger and William C. Goltsos, *IEEE Journal of Quantum Electronics*, vol. 28, No. 4, Apr. 1992, pp. 1088–1100.

"Offset–plane mirrors transform laser beams," Jerry R. Hobbs, *Laser Focus World*, May 1994, pp. 46, 48, 50.

"Novel beam shaping technique for high–power diode bars," W. A. Clarkson, A.B. Neilson, and D. C. Hanna, *CLEO '94*, Thursday Afternoon, Paper CTh1.2, May 12, 1994, p. 360.

Patent Cooperation Treaty document, "Notification of Transmittal of the International Search Report or the Declaration," Date of Mailing Nov. 8, 1995, 8 pages in length.

*Primary Examiner*—Paul M. Dzierzynski
*Assistant Examiner*—Mohammad Y. Sikder
*Attorney, Agent, or Firm*—Limbach & Limbach L.L.P.

[57] ABSTRACT

An optical system is disclosed for improving the brightness symmetry of a beam emitted from a laser diode where the beam has a large width and a narrow height. The optical system includes a tilt plate for displacing one half of the width of the beam downwardly. A first beam steering prism functions to tilt the remaining, second half of the beam width in a plane parallel to the width dimension so that the second half travels towards the first half. A second beam steering prism is provided to tilt the second half of the beam so that its propagation axis is parallel to the propagation axis of the first half and wherein the second half is stacked above the first half. The optical system functions to improve the brightness symmetry of the beam by a factor of about five. The corrected beam can be used to improve the performance of a solid state laser which is end pumped by a broad area laser diode or a laser diode bar.

13 Claims, 3 Drawing Sheets

OPTICAL SYSTEM FOR IMPROVING THE SYMMETRY OF THE BEAM EMITTED FROM A BROAD AREA LASER DIODE

This is a divisional of application Ser. No. 08/273,889 filed Jul. 12, 1994, now U.S. Pat. No. 5,557,475, filed Sep. 17, 1996.

TECHNICAL FIELD

The subject invention relates to an optical system for improving the brightness symmetry of the output beam generated by a broad area laser diode. The optical system is particularly suited for improving system efficiency when a broad area laser diode or laser diode bar is used to end pump a solid state laser.

BACKGROUND OF THE INVENTION

Over the last decade, there has been significant developments in the area of solid state laser systems which are optically pumped using a laser diode. Laser diodes are desirable as pump sources since they are compact and do not create the heating problems encountered with other light sources such as flashlamps. The light from the laser diode can also be focused allowing for relatively efficient longitudinal or end pumping configurations.

There are also some drawbacks to using laser diodes. One significant problem relates to the fact that laser diodes (and particularly high power laser diodes) have an emitter region with a linear geometry and produce an asymmetric output wherein the width is much greater than the height. In a diode pumped laser system, maximum efficiency is achieved when the mode volume of the laser diode is matched well with the circulating mode of the laser resonator. Ideally, the circulating mode of the beam is relatively symmetric so that a $TEM_{oo}$ or fundamental mode output can be generated. Significant efforts are therefore required in order to modify the highly asymmetric laser diode output beam in order to match the symmetric resonator beam.

In practice, most efforts at modifying the asymmetric output of the laser diode are directed towards improving the "spatial" symmetry of the beam. Using various optical elements such as prisms and lenses, the aspect ratio of the beam can be modified. Unfortunately, spatial asymmetry is only part of the problem. More specifically, broad area emitters also have severe "brightness" or "radiance" asymmetry. Brightness is defined as the number of photons per area per unit solid angle and is inversely proportional to the product of the area times the divergence angle. In a typical high power laser diode, the divergence in the narrow, height dimension is greater than the divergence in the width dimension. However, since the width dimension is so much greater than the height dimension, the brightness in the height dimension can still be a hundred times greater than in the width dimension. In order to maximize the pump efficiency, it would be desirable to minimize the brightness asymmetry.

Unfortunately, these asymmetries in brightness are not modified with the basic optics used to correct for spatial asymmetries. More specifically, when a basic optical system is used to reduce the width of the beam, the divergence will proportionally increase. As can be appreciated, since the product of the width and divergence remains the same, brightness will not be effected. Therefore, there is a need for an improved optical system which can not only modify the spatial asymmetries but modify the brightness asymmetries as well so that higher power laser diodes can be used to pump lasers.

Accordingly, it is an object of the subject invention to provide an optical system for improving the brightness symmetry of the output of a broad area laser diode or laser diode bar.

It is another object of the subject invention to provide an optical system for improving the mode quality symmetry of the output of a broad area laser diode.

It is a further object of the subject invention to provide an optical system for improving the symmetry of the output of a broad area emitter so that it can be more efficiently coupled into the end of a symmetric target such as a gain medium or an optical fiber.

It is still another object of the subject invention to provide a diode laser pumped solid state laser capable of generating a higher output power.

SUMMARY OF THE INVENTION

In accordance with these and other objects, the subject invention provides for an optical system for modifying the symmetry of a broad area emitter or laser diode bar so that the brightness in the wide axis can be substantially increased allowing for more efficient coupling of light energy into a symmetric target. The optical system of the subject invention functions to divide the beam into two halves along the width dimension. One half of the beam is displaced downwardly. The remaining half of the beam is then shifted over so that it stacked above the first half and travels along a parallel propagation axis.

Using this approach, the total width of the beam is reduced by one half while the height is doubled. Since the portions of the beam are merely shifted (and not reshaped) the divergence will not change. Moreover, since the area in the width dimension is reduced by fifty percent while the divergence remains the same, the brightness in the width dimension will be doubled. The subject system functions to improve both the spatial and brightness symmetry of the beam such that the beam can be more efficiently matched with a symmetric target such as the mode volume in an end pumped laser gain medium.

In the preferred embodiment, a tilt plate is aligned with a first portion of the beam and functions to displace the first portion in a direction parallel to the height axis. A first beam steering prism is aligned with the remaining second portion of the beam and functions to angularly deviate the beam so that it is directed towards the first portion. Once the second portion crosses over the first portion, a second beam steering prism is utilized to angularly deviate the beam in the opposite direction so that both beam portions will travel along parallel propagation axes.

The subject optical system has been used to couple light from a broad area emitter into a solid state laser resonator. This system has allowed the output power of the laser to be doubled.

Further objects and advantages of the subject invention will become apparent from the following detailed description taken in conjunction with the drawings in which:

DETAILED DESCRIPTION OF THE PREFERRED EMBODIMENTS

Figure 1:
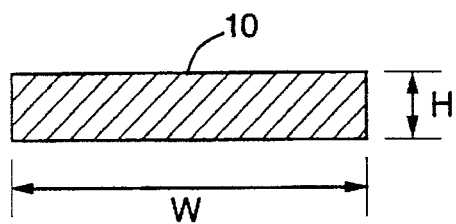
FIG. 1 is a cross sectional view of an asymmetic beam generated by a broad area diode.

Referring to FIG. 1, there is illustrating a cross-sectional view of the output beam 10 which is typically generated by a broad area laser diode. The ratio of the width to the height for a commercial four watt laser diode is on the order of 500 to one. The divergence in the width axis is about twelve degrees while the divergence in the height axis is about thirty degrees. This results in a brightness asymmetry of which exceeds 100 to one. Output beams having even greater asymmetric configurations are generated by laser diode bars.

Figure 2:
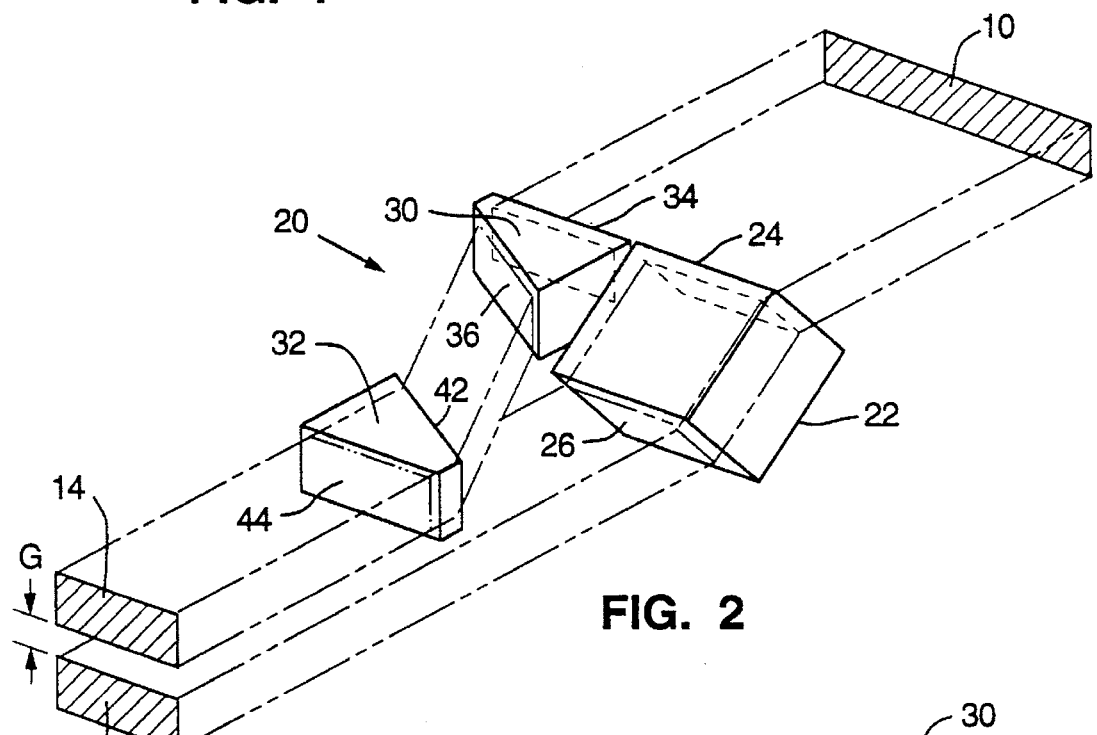
FIG. 2 is a perspective view of the optical system of the subject invention for improving the brightness symmetry of the asymmetric beam shown in FIG. 1.
Figure 3:
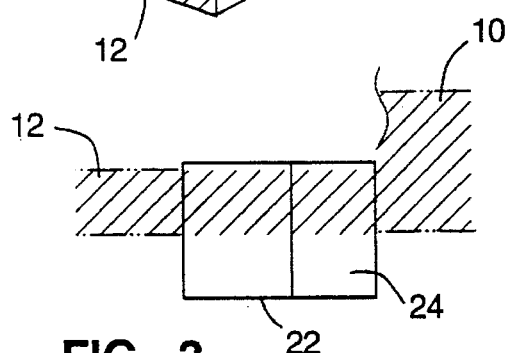
FIG. 3 is top plan view of the tilt plate used to downwardly displace a first portion of the beam.
Figure 4:
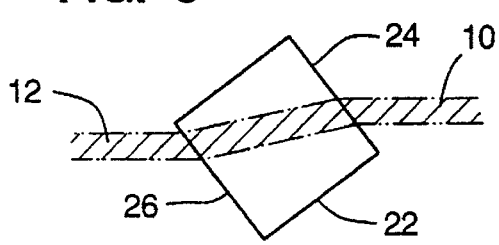
FIG. 4 is side plan view of the tilt plate used to downwardly displace a first portion of the beam.

This brightness asymmetries can be improved with the optical system 20 of the subject invention. More specifically and as shown in FIGS. 2 through 6, the subject optical system includes a first element 22 for displacing a portion of the beam in the downward direction. As best seen in FIGS. 3 and 4, element 22 is positioned to intercept the full height of the beam 10 and a first portion 12 equal to about one-half of the beam width. In the preferred embodiment, element 22 is defined by a cubic tilt plate having opposed parallel faces 24 and 26. Faces 24 and 26 should be provided with an antireflection coating. The refraction which occurs at the input face 24 deflects the beam portion 12 downwardly. The refraction which occurs at the output face 26 reorients the beam portion 12 so that its propagation axis is parallel to, but downwardly displaced from the input beam 10.

Figure 7:
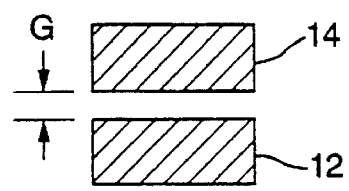
FIG. 7 is a cross-sectional view of the beam of FIG. 1 after passing through the optical system of the subject invention.
Figure 5:
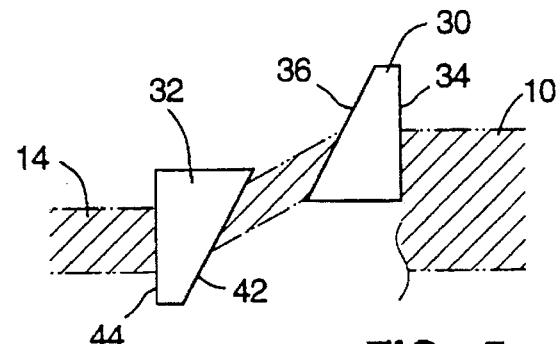
FIG. 5 is top plan view of the prism pair used to shift a second portion of the beam over on top of the first portion of the beam.

The subject invention further includes an optical means for shifting the second portion of the beam 14 over the first portion 12 such that both portions of the beam travel along parallel propagation axes in a stacked configuration as shown in cross-section in FIG. 7. In the first embodiment, the optical means for shifting the beam includes a pair of beam steering prisms 30 and 32. The first prism 30 is aligned with the second, remaining portion 14 of the width of the beam. The input face 34 of prism 30 is aligned to be normal to the propagation axis of the beam. The output face 36 is formed at an oblique angle which causes the beam to refract in a plane parallel to the width axis as seen in FIGS. 2 and 5. The angle of deviation can be between 20 and 40 degrees and is preferably between 25 and 35 degrees.

The refraction of portion 14 of the beam causes the beam to travel towards the first portion 12. Prism 32 is positioned at the spatial location where portion 14 crosses above portion 12. Prism 32 functions to angularly deviate the beam 14 in the opposite direction so that the propagation axis is parallel to the original direction of propagation and parallel to the propagation axis of portion 12.

Prism 32 is preferably identical in structure to prism 30. In addition, output face 36 of prism 30 and input face 42 of prism 32 are disposed at Brewster's angle with respect to the polarization state of the beam. By this arrangement, transmission is maximized without the need for antireflection coatings. Preferably, input face 34 of prism 30 and output face 44 of prism 32 are provided with antireflection coatings to maximize transmission.

Figure 6:
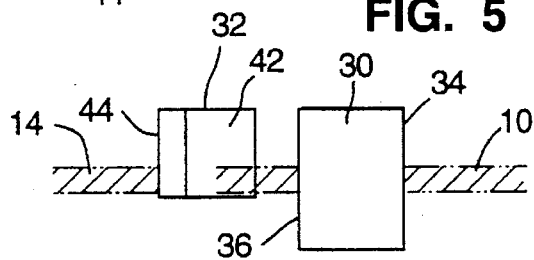
FIG. 6 is side plan view of the prism pair used to shift a second portion of the beam over on top of the first portion of the beam.

As seen in FIGS. 2 and 6, prism 32 must be positioned above beam portion 12 so that little or no energy from portion 12 will be intercepted and redirected by the prism. To facilitate alignment, the elements should be configured to provide a small gap "G" between the upper and lower portions 12 and 14. By this arrangement, scattering losses can be minimized.

The output of the optical system 20 is illustrated in FIG. 7. As can be seen, the two portions (12, 14) of the beam are stacked and have parallel propagation axes. The total width of the beam has been reduced by fifty percent while the divergence has remained unchanged. For this reason, the brightness in the width axis will have been doubled. In addition, the mode quality of the beam in this axis will also be improved by a factor of two. Conversely, the height of the beam has been more than doubled which will reduce brightness in the height axis by at least a factor of two. Thus, the subject optical system can produce at least a four fold improvement in the brightness symmetry.

Although the use of a tilt plate and prism pair are believed to be a preferable approach to implementing the subject system, other variations are possible. For example, beam portion 12 can be downwardly displaced by a pair of prisms rather than with a single tilt plate. It would also be possible to use a pair of mirrors to achieve the same result. Similarly, a pair of mirrors could be used to angularly deviate the second portion of the beam 14 in the place of prisms 30, 32.

Figure 8:
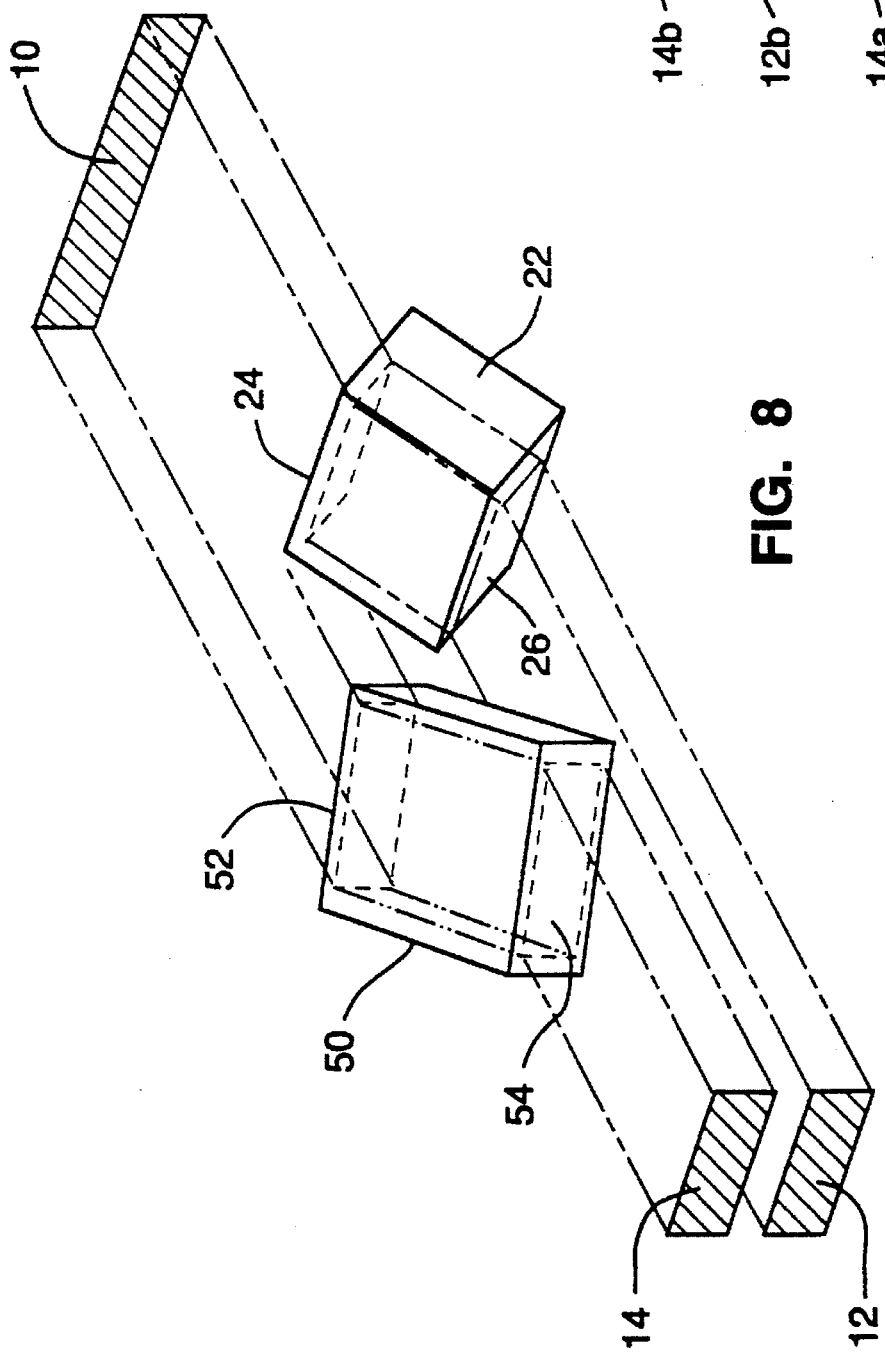
FIG. 8 is a perspective view of an alternate embodiment of the optical system of the subject invention for improving the brightness symmetry of an asymmetric beam.

Another alternative is illustrated in FIG. 8. As in the first embodiment, a tilt plate 22 is used to downwardly deflect the first portion 12 of the beam. Unlike the first embodiment, where a prism pair is used to steer the second beam portion 14, a tilt plate 50 performs that function. Tilt plate 50 can have a similar configuration to the tilt plate 22. However, the input face 52 of tilt plate 50 is rotated about the height axis rather than about the width axis of the beam. By this arrangement, when the beam portion 14 enters the input face 52, it is refracted towards the output face 54 in a plane parallel to the width axis. When beam portion 14 passes through the output face, it is refracted back so that its propagation axis is parallel to the propagation axis of the first portion 12 and the two portions travel in a stacked, aligned configuration.

In this alternate embodiment, it is necessary that tilt plate 50 be located downstream from the first tilt plate 22. As can be seen, the output face 54 of the tilt plate 50 must fall in the spatial region where the first portion 12 of the beam is traveling prior to its interaction with the first tilt plate 22. Therefore the tilt plates could not be placed side by side in the manner shown for the tilt plate 22 and prism 30 of the first embodiment.

Figure 9:
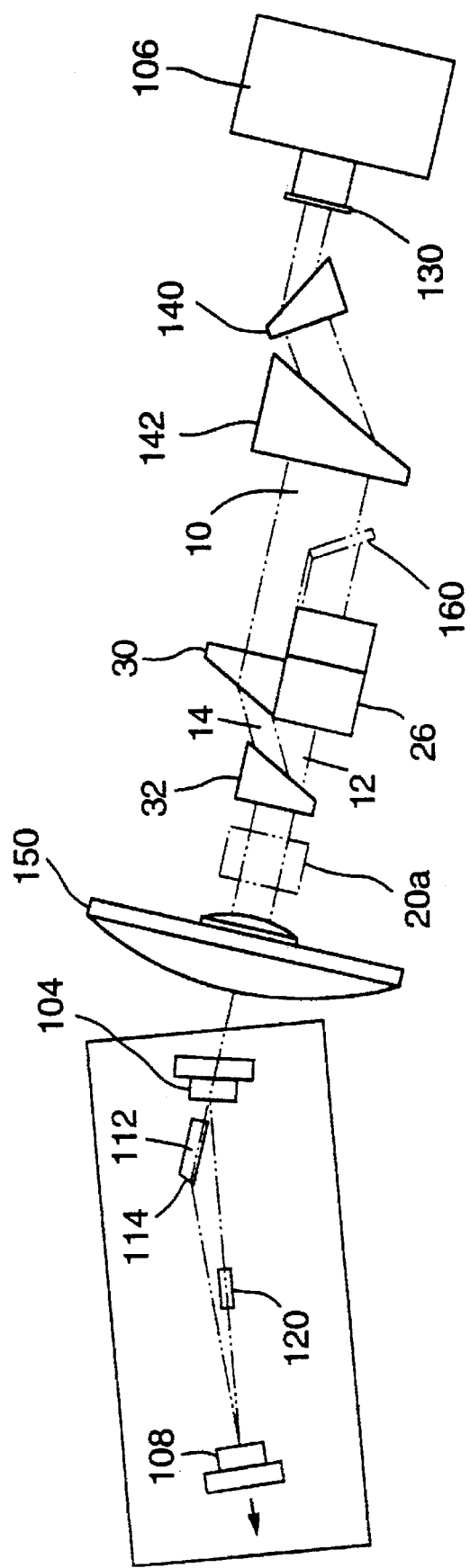
FIG. 9 is a top plan view of the preferred embodiment of a diode pumped solid state laser using the optical system of the subject invention.

FIG. 9 illustrates the use of the first embodiment of the optical system 20 in a longitudinally pumped solid state laser 102. The resonator of laser 102 is a unidirectional ring as described in detail in U.S. Pat. No. 5,052,815. The resonator assembly details are described in U.S. Pat. No.

5,170,409. The principle difference between the laser assembly illustrated in U.S. Pat. No. 5,170,409 and the subject invention relates to the use of the optical assembly 20 for improving the brightness symmetry of the beam. Lasers formed in accordance with the teachings of the above cited patents are marketed by the assignee herein, Coherent, Inc., under the trademark DPSS with a STAR resonator. The elements of the laser will be briefly described herein. Additional details can be found in the above cited patents.

As illustrated in FIG. 9, the laser resonator includes a first mirror 104 which is transmissive to the 808 nm pump beam radiation from the laser diode 106 and is reflective of the circulating radiation. The resonator also includes a second mirror 108 which also serves as the output coupler. A solid state gain medium 112 is located within the resonator. In the commerical embodiment, the gain medium is formed from Nd:YAG. As described in U.S. Pat. No 5,052,815, one face 114 of the YAG crystal is formed with a refracting surface which allows a ring resonator to be formed with only two reflecting mirrors.

The resonator of laser 102 further includes a non-linear, frequency doubling crystal 120. In the commercial embodiment, the crystal is formed from KTP. In this embodiment, both mirrors 104, 108 are coated for maximum reflectivity at the fundamental wavelength (1.06 microns). Mirror 108 is highly transmissive (about 95 percent) to the 532 nm radiation to maximize the output coupling of the frequency doubled radiation.

The gain medium 112 is pumped with the light from the laser diode 106. In the previous commercial embodiment, a two Watt broad area laser diode manufactured by SDL was used to generate a rated output of 200 mw at 532 nm. In an effort to increase this output, a more powerful pump laser was utilized. In the preferred embodiment described herein, a four Watt broad area laser diode manufactured by SDL (SDL Model No. 2382-P1) was used. This diode laser had an expanded emitter area with a height of approximately one micron and a width of 500 microns. In order to efficiently couple the light from the higher power diode into the resonator, the optical system 20 of the subject invention was developed.

Similar to the prior art coupling arrangement, the light from the diode 106 is first collimated by lens 130. Lens 130 has the effect of changing the beam size to roughly two millimeters in height by three millimeters in width. Next the beam is anamorphically expanded by a pair of prisms 140 and 142. After passing through this prism pair, the beam will still have a height of about 2 millimeters but the width will be expanded to about 10 millimeters. The beam is expanded so that it can ultimately be focused to a smaller spot by lens 150.

The beam is then passed through the optical system 20 of the subject invention. As noted above, the tilt plate 22 functions to downwardly displace a first portion 12 of the beam 10. A suitable tilt plate can be formed from a 0.5 inch cube of BK-7 glass. The first beam steering prism 30 functions to angularly displace a second portion 14 of the beam in plane parallel to the width axis of the beam. In the preferred embodiment, the displacement angle is 30.5 degrees. Complementary beam steering prism 32 functions to displace the beam portion 14 once again so that its propagation axis is parallel to the propagation axis of beam portion 12. The stacked portions of the beam (as illustrated in FIG. 7) propagate to a lens 150. Lens 150 functions to focus the beam into the mode volume of the laser resonator in the gain medium.

In order to maximize the output power of the laser, and take advantage of the higher input power, it is important that the transmission characteristics of the optical system 20 be relatively high (at least eighty percent.) One method of achieving this goal is to insure that the elements are arranged to reduce scattering loss. In the preferred embodiment, prism 30 and tilt plate 22 are mounted together. A thin layer of glue is used to attach the elements together so that the junction is narrow and transmission losses are minimized.

Interestingly, it was noted that the output emission pattern of the SDL diode used in the experiments had a centrally located brightness minimum extending in the width dimension. The physical origin of the minima is a 50 micron void located in the center of the 500 micron laser diode emission area. By placing the mechanical union between the tilt plate and the prism at this minima, the beam scattering loss can be further reduced.

The placement of the optical system 20 downstream from the anamorphic prisms 140 and 142 also helps to reduce scattering loss. More specifically, since the prisms expand the beam in the width dimension, less light energy is available at the interface between the tilt plate and the prism 30. It should be noted that the optical system could also be positioned between the two anamorphic prisms, however, some additional scattering loss would be expected.

Another approach to reducing beam scattering at the interface would be to modify the lay-out shown in FIG. 9 by inserting a plate 160 (shown in phantom line in FIG. 9) in front of the optical system 20. Plate 160 can be disposed at Brewster's angle and would function to displace one half of the beam laterally (parallel to width axis) in a manner similar to tilt plate 50 (FIG. 8). The two beam halves would then be spatially separated and would not have to intersect the connection between the tilt plate 22 and the prism 30.

As noted above, it is also desirable to control the propagation paths so that a gap "G" (FIG. 7) is created between the beams. The size of the gap G is controlled by the angle of the tilt plate 22. In the preferred embodiment, the tilt plate is set to an angle of incidence of 38 degrees with respect to incoming beam and the gap "G" is on the order of 1.4 millimeters. Since the beam has a gaussian intensity distribution and in reality does not have the sharp edges illustrated in the Figures, this gap prevents the upper edge of the lower portion 12 of the beam from intercepting the lower edge of prism 32.

One additional benefit of providing the gap "G" is that height dimension of the beam cross-section is increased which further improves the brightness symmetry. In the preferred embodiment, the width of the beam portions (as shown in FIG. 7) is on the order of five millimeters. The height of each of the individual portion is about two millimeters, so the total height of the beam (including the 1.4 millimeter gap g) is about 5.4 millimeters.

Based on the dimensions given above, the improvement in brightness symmetry can be calculated. More specifically, the brightness of the light emitted from the diode 106 in the height dimension is more than 100 times greater than the brightness in the width dimension. After passing through the optical system 20 of the subject invention, the brightness in the width dimension will be increased by a factor of two, while the brightness in the height dimension will be reduced by a factor of 2.5 so that the brightness symmetry will have been improved by a factor of five.

It should be noted that there are other methods for increasing the pump power into the laser cavity. One prior art approach is to use two diode lasers and overlap the output beams. Unfortunately, in order to overlap the propagation axes of two beams relatively complex and expensive polarization multiplexing schemes must be used. In contrast, using the techniques herein, an improved result can be achieved with simple, low cost optical elements. In fact, the total cost of the three optical elements is under eighty dollars.

Another advantage of the subject system is that the transmission losses are quite low. In experiments it has been determined that the transmission less created by the tilt plate and two prisms is only about three percent. The total transmission loss of all of the optical elements from the laser diode 106 to the focusing lens 150 is on the order of ten percent. Thus, a very high percentage of the light generated by the laser diode may be focused into the gain medium.

In experiments utilizing the subject optical system 10, a four Watt laser diode was used to pump a laser resonator as described above. An output power of 550 milliwatts at 532 nm was generated.

Figure 10:
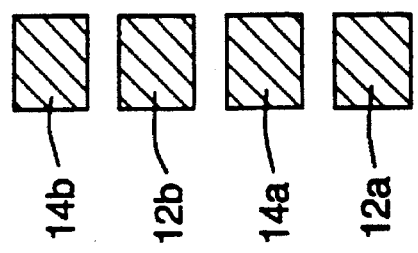
FIG. 10 is a cross-sectional view of the beam of FIG. 7 after passing through a second optical system of the subject invention.

As noted above, the subject optical system can improve the brightness asymmetry by a factor of five. Even with this improvement, the brightness in the height dimension is still significantly brighter than in the width dimension. If further improvements are desired, it would be possible to place one or more additional optical systems 20 in the beam path in a cascaded fashion. The optical elements of the second system (shown as a phantom block at 20a in FIG. 9) would have a height at least equal to the combined height of the two beam portions (12, 14) and a width equal to one half of the five millimeter beam width. When placed in the path of the stacked beam portions 12 and 14, the resultant output would be produce four stacked beam segments in a pattern as shown in FIG. 10. The portions 12a and 14a derive from the right halves of the segments 12 and 14 of FIG. 7, while the portions 12b and 14b derive from the left halves of segments 12 and 14 of FIG. 7. As compared to the beam shown in FIG. 7, the width of the segments would be reduced by fifty percent and the total height of all the segments would be increased by more than fifty percent. Using one additional optical system 20a, the brightness symmetry of the beam could be improved by a another factor of five.

Although in the illustrated embodiments, the optical elements are configured to divide the width of the beam in half, other geometries could be used. Variations could be particularly useful where multiple optical systems 20 are used in a cascaded fashion. In this case, geometries could be employed which would allow the shape of the beam to be modified, such as by making the beam more round.

As noted above, the subject optical system 20 may be useful in applications other than longitudinally pumping a solid state gain medium. For example, similar considerations are relevant when attempts are made to launch light into the aperture of an optical fiber. Thus, the subject optical system could be used to improve the brightness asymmetry in a device where energy from a laser diode is to be coupled to an optical fiber for remote delivery.

It should be noted that terms such as downward, over and below are used in the specification merely to simplify the discussion and are not intended to limit the subject invention.

While the subject invention has been described with reference to the preferred embodiments, various changes and modifications could be made therein, by one skilled in the art, without varying from the scope and spirit of the subject invention as defined by the appended claims.

We claim:

1. An optical system for modifying the energy distribution of a light beam having a cross-section wherein the width is greater than the height comprising:

a first optical element aligned with the beam along a first portion of the width, said first optical element functioning to displace the first portion in a direction parallel to the height axis;

a second optical element aligned with the beam along a second portion of the width, said second element functioning to angularly deviate the second portion in a plane parallel to the width axis so that the second portion is redirected towards the first portion; and a third optical element aligned with the angularly deviated second portion, said third optical element functioning to angularly deviate the second portion in a plane parallel to the width axis such that the first and second portions become aligned and travel along parallel propagation axes thereby improving the brightness symmetry of the beam.

2. A system as recited in claim 1 wherein said first and second portions are substantially equal in width.

3. A system as recited in claim 1 wherein the aligned first and second portions are spatially separated to avoid losses due to scattering.

4. A system as recited in claim 1 wherein said optical elements are refractive optical elements.

5. A system as recited in claim 4 wherein said first optical element is a tilt plate.

6. A system as recited in claim 4 wherein said second and third optical elements are prisms having input and output faces.

7. A system as recited in claim 6 wherein the output face of the second optical element and the input face of the third optical element are oriented at Brewster's angle with respect to the propagation axis of the beam.

8. A system as recited in claim 1 wherein said first optical element is a tilt plate and said second optical element is a prism and wherein said tilt plate and prism are mounted together and wherein the axis along which the prism and tilt plate are joined is aligned with the center of the beam.

9. A system as recited in claim 1 wherein the angular deviations created by each of the second and third optical elements is in the range of 20 to 40 degrees.

10. A system as recited in claim 1 wherein the angular deviation created by each of the second and third optical elements is in the range of 25 to 35 degrees.

11. A system as recited in claim 1 wherein the optical elements function to increase the brightness of the beam in the width dimension by a factor of two.

12. A system as recited in claim 1 further including a fourth optical element aligned with the first portion of the beam and positioned in front of the other optical elements, said fourth optical element functioning to displace the first portion of the beam from the second portion in a plane parallel to the width axis to minimize scattering losses.

13. A system as recited in claim 1 wherein said optical elements transmit at least eighty percent of the beam.

* * * * *